United States Patent [19]
Davis et al.

[11] Patent Number: 5,976,306
[45] Date of Patent: Nov. 2, 1999

[54] METHOD AND APPARATUS FOR REMOVING DIE FROM AN EXPANDED WAFER AND CONVEYING DIE TO A PICKUP LOCATION

[75] Inventors: Peter Davis, Santa Cruz; Dean Tarrant, San Jose, both of Calif.

[73] Assignee: Hover-Davis, Inc., Spencerport, N.Y.

[21] Appl. No.: 09/025,564

[22] Filed: Feb. 18, 1998

[51] Int. Cl.[6] .................................................. B32B 35/00
[52] U.S. Cl. .................. 156/344; 156/584; 29/426.3; 29/426.6; 438/464
[58] Field of Search .................................... 156/344, 584; 438/33, 68, 113, 114, 464, 465, 976, FOR 386; 29/426.1, 426.3, 426.5, 426.6, 762

[56] References Cited

U.S. PATENT DOCUMENTS

| | | |
|---|---|---|
| 4,437,232 | 3/1984 | Araki et al. . |
| 4,876,791 | 10/1989 | Michaud et al. . |
| 5,671,530 | 9/1997 | Combs et al. . |

FOREIGN PATENT DOCUMENTS

WO97/32460  9/1997  WIPO .

OTHER PUBLICATIONS

Newsome, Robert, "Meeting the Increasing Demands of Assembling Advanced Packages," *Electronic Packaging & Production*, Jan., 1998; pp. 38–44.

Mullens, Brian, "Chip–On Board Assembly Methods," *Electronic Packaging & Production*, Apr. 1997; pp. 47–50.

*Primary Examiner*—Mark A. Osele
*Attorney, Agent, or Firm*—Leonard Heyman

[57] ABSTRACT

A direct die feeder picks known good die from an expanded wafer and places them on a conveyor belt, which conveys the die to a pickup location. Frame (111) supports an expanded wafer (105) which is a wafer that is sawed and adhered onto a flexible film, which is then stretched and mounted in a ring (110). A fork member (125), on which a pick head (150) is mounted slides along an x-axis and frame (111) slides along a vertical axis to allow the pick head (150) to access any die from the expanded wafer. A camera (160) is directed downward at a 45° mirror adjacent to the pick head to capture images of the wafer and determine the precise locations of known good die on the wafer. The pick head (150) can pick die from the wafer and place them directly on the conveyor belt (170) in the conventional orientation, or pass the die to a transfer head (155) which then shifts to the left and lowers the die down past the pick head, placing the die on the conveyor belt in the flipped orientation. The conveyor belt operates until a die is detected at a pickup location (173) at one end of the conveyor except during placing operations of the pick head or transfer head.

14 Claims, 6 Drawing Sheets

METHOD AND APPARATUS FOR REMOVING DIE FROM AN EXPANDED WAFER AND CONVEYING DIE TO A PICKUP LOCATION

BACKGROUND OF THE INVENTION

This invention relates generally to the surface mounting of integrated circuits (ICs), and more particularly, to a die feeder device that performs the function of removing each IC, or die, from a sawed, expanded wafer disposed on a flexible adhesive film, placing the die on a conveyer, and conveying the die to a pick-up location.

In the mass production of printed circuit boards having a plurality of ICs surface-mounted thereon, automated machinery accept die from "chip feeders" and then mount them at a predetermined location on the circuit board. The chip feeders have previously taken the form of tape and reel-type feeders which remove the die from a plastic tape and present them to the automated assembly machinery. An example of a reel type tape feeder is shown in U.S. Pat. No. 4,437,232, issued to Araki et al. on Mar. 20, 1984. The advantage of the tape feeders is that they take up a small amount of space during the assembly of the circuit board, thus a large number of tape feeders can be placed adjacent to one another and utilized by a single assembly machine. Tape feeders are also capable of feeding die at a very rapid pace. The present invention takes the place of these "tape feeders" and obviates the steps of placing die onto the plastic tape then removing them from the plastic tape. The present invention is capable of performing this function of presenting die serially directly from a wafer without taking up significantly more space than a tape feeder. By reducing the handling of bare die on its journey from wafer to assembly, significant expense reduction is realized, and the opportunity for damage to individual die is reduced, which improves the reliability of the end product.

Because the present invention is intended to replace current tape feeders, it is designed to maintain the narrow form-factor width standard of 80 mm which is common in the industry. The narrow width enables many die feeders of the present invention to be positioned side by side down the length of an assembly conveyor which carries printed circuit boards from station to station while various electrical components are installed on them without taking up too much floor space. Maintaining this narrow profile required many design innovations herein disclosed.

The present invention picks die from an expanded wafer and presents them, via a conveyor, to an automated assembly machine. The use of an expanded wafer provides important advantages when picking die. "Expanded wafer" means a sawed wafer placed on a flexible adhesive film which is then stretched so that individual die can be spaced from one another. The film is then maintained in this stretched condition by placing it between two rings clamped together. The gap between adjacent dies permits reliable pickup and prevents "chip-out" (damage to the picked die or adjacent die caused by scraping the die edges during pick-up). In addition, a machine vision system is employed by the present invention to perform die recognition using the die edges, which requires gaps between the die, permitting them to be perceived by a visual imaging apparatus.

U.S. Pat. No. 4,876,791 to Michaud et al. discloses an apparatus for removing die from an expanded wafer and placing the die on a substrate. This patent teaches holding the expanded wafer horizontally with the wafer side facing down. A pick and place head is positioned beneath the wafer and above the horizontally-disposed substrate. This configuration permits the pick and place head to remove the die from the wafer and place it on the substrate with minimal movement. However, it suffers from the disadvantage that it is not compatible with existing assembly machinery and requires a significant amount of horizontal real estate, which becomes especially problematic when a plurality of chips are to be placed on each substrate. In this case the substrate must make a separate stop beneath each wafer and a separate mounting assembly must be utilized for each chip to be placed on the substrate.

Although direct die feeders have been known in the prior art, industry has not accepted them. Presumably, this is so because they lack specific features required by the industry, such as the high speed and small footprint currently made possible by the tape feeders.

U.S. Pat. No. 5,671,530 to Combs et al. discloses an apparatus which removes die from an expanded wafer oriented vertically for use in the environment intended for the present invention. The patent to Combs et al., however, suffers from the disadvantages of only being capable of handling one die at a time using pick and place head assembly 104 shown in FIG. 6 of the Combs et al. patent. Pick and place head assembly 104 travels from a pickup location 96 to a transfer location 106. Head assembly 104 cannot return to the pickup location 96 until the circuit board assembly machinery takes the die at transfer location 106. This pick-move-transfer-move-pick cycle is extremely time-inefficient, making the system impractical for many customers who mass produce circuit boards. It is important to understand that the conveyor shown in the Combs et al. patent operates to transport printed circuit boards during assembly, not to transport bare die to a pickup location as does the conveyor of the current invention.

The Combs et al. patent also suffers from the disadvantage of only being able to present chips in a "flipped" (circuit-down) orientation. There are currently two primary methods of surface-mounting chips onto a substrate or circuit board. The conventional wire-bond or tape-bond methods includes placing the chip on the substrate in the conventional, circuit-up orientation, and electrical connections being made from electrical contacts on the top of the chip to contacts on the substrate using metal wires or tape. The flip-chip method includes forming solder bumps on the art side of the die, then placing the die, circuit-down on the substrate, aligning the solder bumps on the die with metal contacts on the substrate and holding the die in position while electrical and mechanical connection is made by reflowing the solder bumps. The Combs et al. invention is limited by only being capable of presenting chips in the flipped orientation.

SUMMARY OF THE INVENTION

The present invention overcomes the disadvantages of the prior art noted above. The chip feeder of the present invention takes the place of conventional tape feeders, and is therefore compatible with existing assembly machinery. Through the use of a novel conveyor belt, die can be transported to the pickup location while the pick-head assembly is busy removing more die from the wafer. Additionally, a novel transfer head may operate to accept a die from the pick head and then place the die in the flipped position on the conveyor or the pick head can place the die directly on the conveyor in the conventional orientation, if required. Thus, the present invention is capable of presenting the die in the proper orientation for either the conventional or the flipped methods of mounting.

The die conveyor extends the full length of the feeder and traverses the entire wafer. This feature minimizes pick head movement from die removal from the expanded wafer to placement at any convenient location on the conveyor, requiring that the pick head stroke only 30 mm and rotate 180° to execute one die extraction and conveyer placement cycle. The reduced motion of the pick head translates into rapid die removal from the expanded wafer. The conveyor also facilitates buffering of die to the extraction point, which permits assembly machines to take a cluster of die from the conveyor in rapid succession if they have that capability. By accepting a cluster of die in rapid succession using, for example, a rotary pick and place head assembly, the assembly machine can operate at peak efficiency. While the assembly machine is busy installing the chips on the circuit boards, the chip feeder will pick die off the wafer and place them on the conveyor, loading the conveyor for the mounting heads' return to take the next cluster of die from the feeder. Buffering of die also provide the practical advantage of being able to exchange wafers without shutting down the line.

These and other advantages of the present invention will become clear in the following Detailed Description of the Preferred Embodiment.

DETAILED DESCRIPTION OF THE PREFERRED EMBODIMENT

Figure 1:
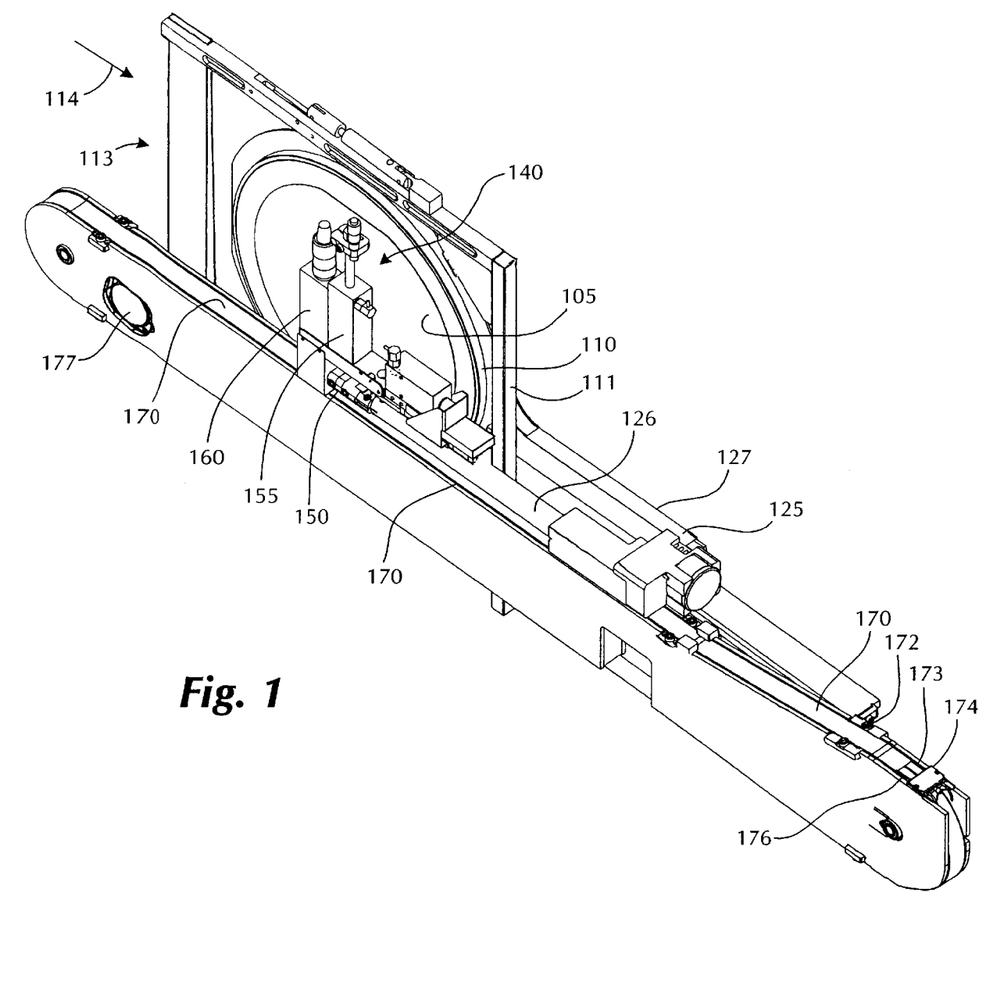
FIG. 1 shows the preferred embodiment of the present invention in perspective view, absent its cover.
Figure 10:
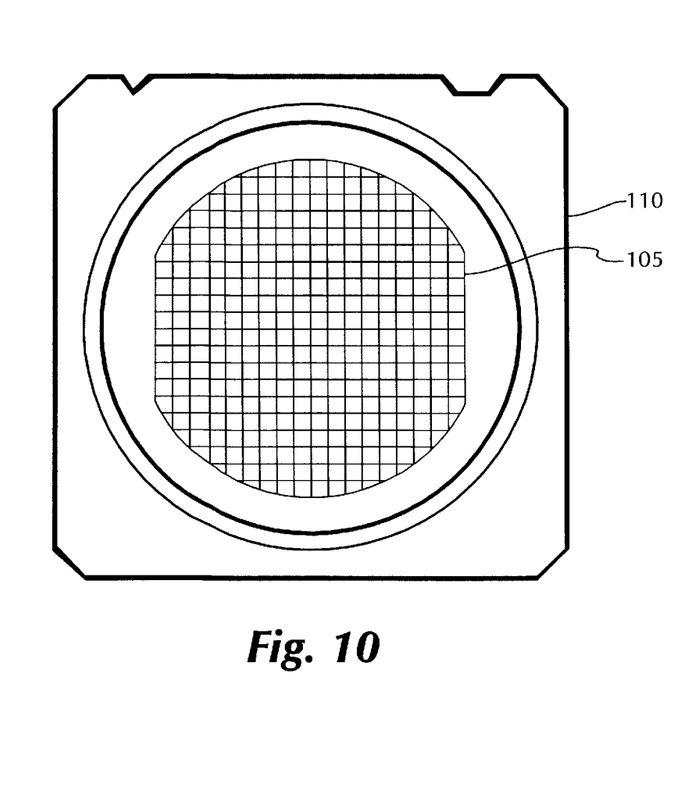
FIG. 10 is an example of an expanded wafer in a mounting ring.

Referring now to the drawings, FIG. 1 shows a partially-disassembled chip feeder 100 in perspective view. Expanded wafer 105 is held in ring 110 which is supported by frame 111. Wafer 105 is an expanded 8 inch wafer, however the frame 111 can also position other sized wafers and the invention can be adapted to accept 12 inch or larger wafers. FIG. 10 shows an example of what an expanded wafer in a ring might look like in plan view. Wafer 105 is inserted through wafer access 113 in the direction of arrow 114, in a manner more particularly described below. Wafer 105 is positioned vertically in frame 111, but this is not a mandatory orientation. While the vertical orientation minimizes the horizontal reach of the profile, the frame can operate at any angle as it rotates on an axis that is parallel to conveyor 170.

Figure 2:
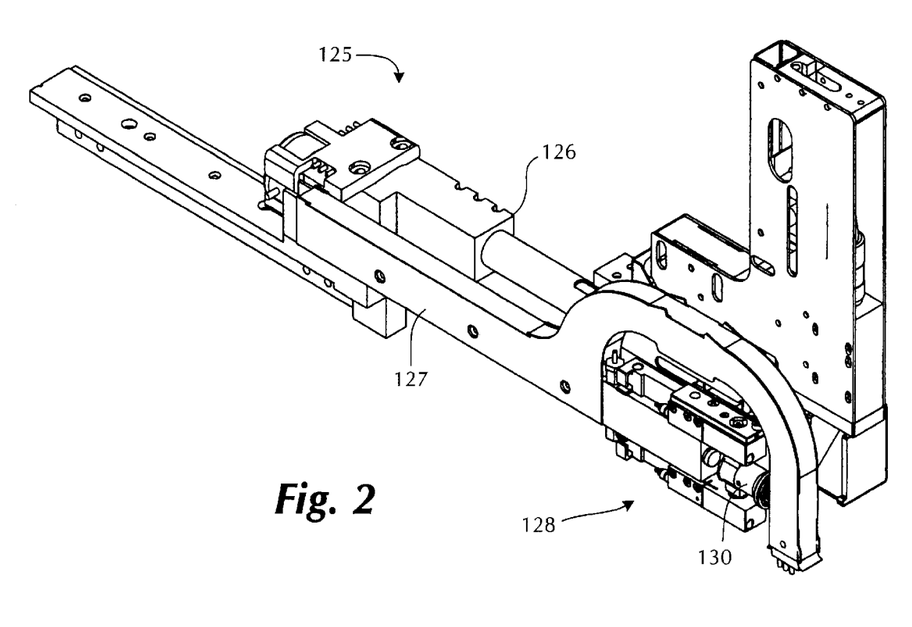
FIG. 2 shows the fork assembly of the invention shown in FIG. 1 from a reverse angle.

To position a selected die at the correct y-coordinate, frame 111 raises and lowers wafer 105 in response to commands from a CPU (not shown). Fork 125, seen in FIG. 1 and from a reverse angle in FIG. 2, incldes die ejector arm 127 which is positioned on one side of wafer 105 and pick head assembly arm 126 which is positioned on the other side of wafer 105. Die ejector arm 127 and pick head assembly arm 126 are mechanically connected and move as a unit in the x-direction in response to commands from a CPU (not shown) to align the pick head 150 and ejector head 130, shown in FIGS. 2–4, with the selected die. By using this fork structure, it is assured that die ejector head 130 will always remain directly behind the wafer and aligned with the pick head device 150 and ensures that x–y movements will remain in a common plane.

Figure 3:
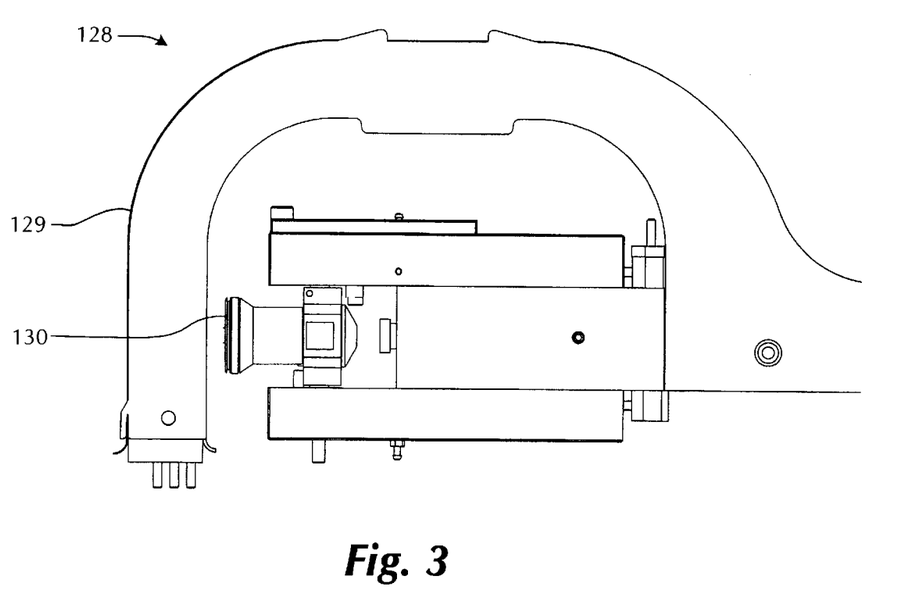
FIGS. 3 and 4 are close-up views of the die ejector head assembly as seen from the wafer to show the movement of the die ejector head.
Figure 4:
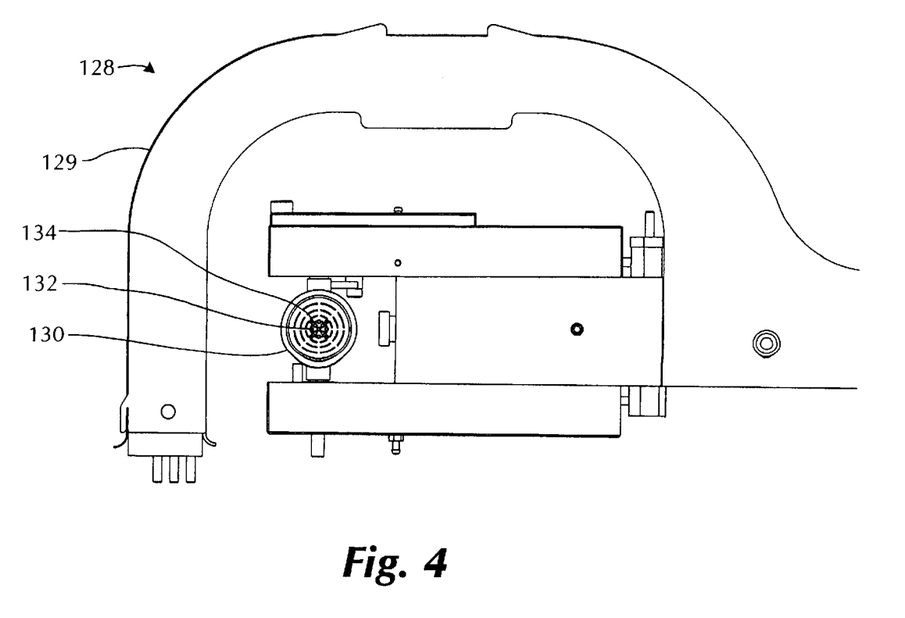

Turning to FIGS. 3 and 4, the die ejector assembly 128 is shown with ejector head 130 shown in a non-rotated position in FIG. 3 and a rotated position in FIG. 4. The head is pneumatically actuated for rotation so that wafer ring 110, which is significantly thicker than wafer 105, shown in FIG. 1 can pass by the non-rotated ejector head 130 during insertion and ejection of the wafer, and also during vision imaging of wafer 105 at the extreme right side of wafer 105 as seen in FIG. 1. By rotating the ejector head as shown, the wafer can be removed while still maintaining the narrow profile of the invention. Guyway 129 provides a means for maintaining control lines to ejector head 150 within the narrow profile of the invention by passing the control lines over the ejector head assembly 128. The rotation of ejector head 130 and pins 134 are actuated pneumatically, but electric motors, solenoids, thermo-electric actuators, or other motivating means can be used instead.

In addition to functioning to eject die from the flexible film on which the wafer is mounted, the ejector head serves another important function: it partially automates the insertion and ejection of the wafer. Looking now to FIGS. 8 and 10, wafer entry and control doors 82 are shown in the open position. The control doors 82 have guides in the form of grooves 84 which ensure that the wafer is properly aligned to the opening during insertion and removal, minimizing the potential for damage to the wafer. By making the upper door 82 shorter than the lower door 82 it is easy to align wafer ring 110 with grooves 84. Once the wafer is inserted, doors 82 are closed. Knobs 83 enable doors 82 to be easily opened. In response to doors 82 being closed, seating of ring 110 inside frame 111 is completed automatically. Fork 125, shown in FIGS. 1 and 2, slides horizontally until ejector head 130 is inside ring 110. Ejector head 130 then rotates to the rotated position shown in FIG. 4 and slides (with fork 125) in the positive x direction, towards pickup location 173, until the side of ejector head 130 engages the inside edge of ring 110. Ejector head 130 continues to the positive x direction, bringing ring 110 to the fully mounted position shown in FIG. 1. During the wafer ejection process, the ejector head 130 performs the same operation in reverse, pushing ring 110 out from outside ring 110, until it can be manually pulled out the rest of the way through doors 82. A single wafer can be inserted into the feeder multiple times for short run production, or simply exhausted in a volume environment.

Figure 5:
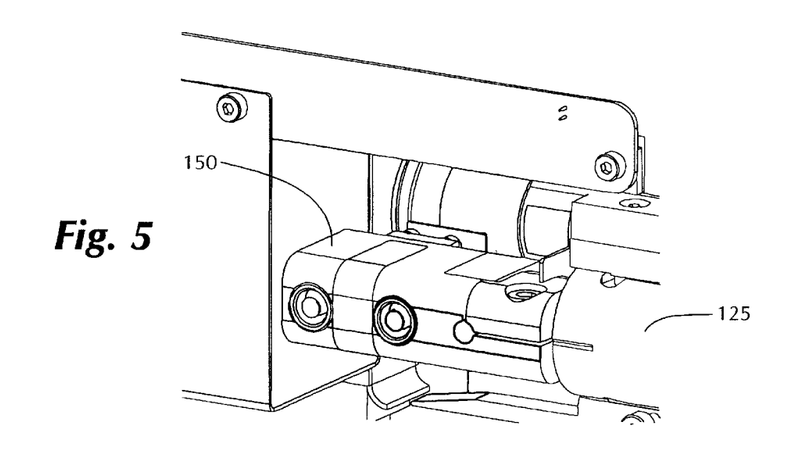
FIGS. 5, 6, and 7 are close-up views of the pick head, which rotates to face the wafer in FIG. 5, face down towards the conveyor belt in FIG. 6, and face up towards the transfer head in FIG. 7.
Figure 7:
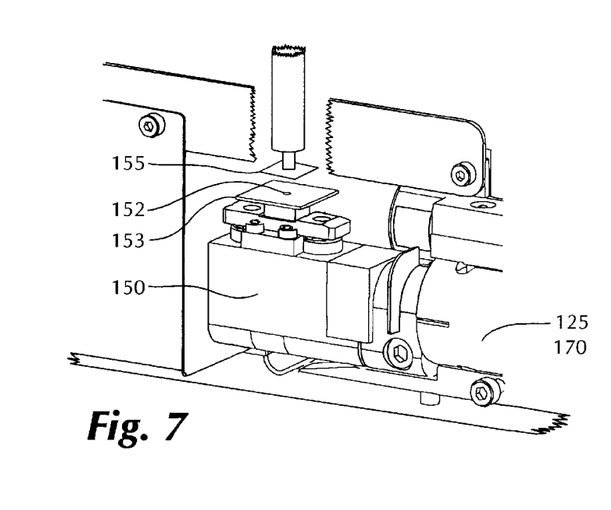

Pick head device 150 includes a suction port 152, seen in FIG. 7, and die ejector head 130 includes a pin structure 134. During the die extraction process, the pick head 150 rotates to face the die as shown in FIG. 5 and the pick head plate extends to come in contact with the selected die. Then the suction port of pick head 150 activates to hold the die against pick head plate 153 once it is released from the adhesive material. Meanwhile, the ejector head 130, in the rotated position shown in FIG. 4, applies suction to the flexible adhesive film that the wafer is mounted on to stabilize the film using suction ports 132. Then, pins 134 extend from the suction ports 132, through the backing material and force the selected die from the material and against pick head 150 where it is held by suction port 152. The number of pins utilized depends in part on the size of the die to be extracted. Pins 134 then retract and pick head plate 153 retracts, separating the die from the wafer. Due to perforations caused by pins 134 in the film, a strong vacuum is necessary to maintain the film against ejector head 130 when removing a die which is adjacent to a recently removed die.

Before removing die it is desirable to know its status so that only good die or die of the correct grade are removed and used leaving disqualified die behind to be dispensed later or discarded with the spent wafer. Two basic methods are commonly employed during the testing process to indicate die quality for down stream processes. The first uses ink dots to mark bad die. Typically the ink dots are black, but they can be of other colors as well. The second method is array mapping of the wafer, in which the physical location of each die, and its status or grade is provided along with the wafer. Using the on board machine vision system the invention can detect ink dots to disqualify die. Additionally, the invention may incorporate off the shelf color and luster comparison to detect ink dots by scanning die for net average variances from a known reference. Technology supports processing of pre-mapped wafers, i.e., wafers provided with maps that disclose array locations of known good die. By pre-map removal of a reference fiducial die off-line as part of the wafer expansion step, a suitably durable scheme could be employed using edge detection technology to reference an array starting point. The maps are generated during testing of the wafer.

Figure 6:
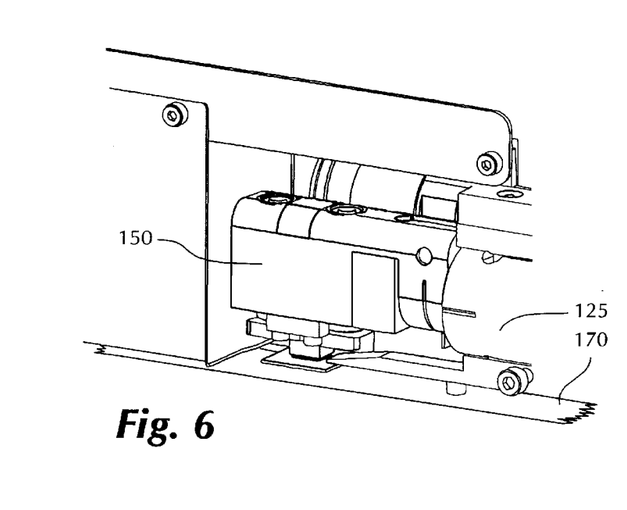

If the die is required to be in a conventional orientation (circuit-up) then the pick head 150 rotates 90° down as seen in FIG. 6. Pick head plate 153 then extends to place the die on conveyor 170, then the die is released by removing suction from port 152, and finally the pick head plate 153 retracts once more and rotates to face the wafer in preparation to pick the next die. Because frame 111 raises and lowers the wafer in the y-direction, the selected die is always adjacent to conveyor 170 and pick head 150 requires only minimal movement to extract the die from the wafer and place it on the conveyor. Furthermore, since the pick head moves in the x-direction, it can place multiple die on the conveyor without any requirement that the conveyor advance. This permits asynchronous operation between the pick head and the conveyor, and allows the conveyor to operate as a buffer between the pick head operation and the assembly machine retrieving die from the conveyor at pickup location 173.

If, however, the die is required to be in a flipped orientation (circuit-down) then the pick head 150 rotates 90° up as shown in FIG. 7 and pick head plate 153 extends upward to place the die in contact with transfer head 155 which also has a suction port (not shown). The suction port of transfer head 155 is activated and suction from port 152 is removed, thus transferring the die from pick head plate 153 to transfer head 155. Pick head plate 153 then retracts and rotates to face the wafer, ready for the next selected die. Meanwhile, the entire assembly 140, indicated generally in FIG. 1 and comprising transfer head 155 and machine vision camera 160, shifts to the left so that transfer head 155 can drop down past pick head 150 to place the die on conveyor 170. After this is done, the suction is removed from transfer head 155 to release the die and the transfer head retracts to its upper position and assembly 140 shifts back to the right. Parallel processing of the flip and pick operations means the cycle times overlap, maximizing throughput.

Once the die is placed on conveyor 170 and released by either pick head 150 or transfer head 155, conveyor 170 is activated to transport the die to pickup location 173 where stop 174 prevents the die from traveling too far and helps to precisely position the die for pickup.

After the die has been released by pick head 150, wafer frame 111 and fork 125 move into position for the next selected die to be removed. Generally, die are removed from the wafer in a right to left, then bottom to top pattern. Since pick head 150 trails the view point of camera 160 while processing a row of die, the CPU (not shown) must determine during the processing of a row of die whether the next pick process or vision process should be done first or if both can be done from the same location. Initially, this means that only the vision process will be running for several die, until pick head 150 is also over the wafer. Near the end of the row camera 160 will run off the left end of the wafer but there still may be die for pick head 150 to pick. This further increases the efficiency of the invention by minimizing movement of the pick head 150. When all the die in a row has been found and picked, pick head 150 moves back to the right most die in the current row and frame 111 lowers one die interval to the start location of the next row.

To maintain the thin profile of the invention, camera 160 is directed downward at a half-silvered mirror (not shown) angled at 45°, for obtaining a normal view of a section of the wafer. A light source (also not shown) is disposed behind the half-silvered mirror to minimize shadows.

The imaging software for die selection is well known in the art and is not part of the present invention. However, it is capable of selecting known good die from the wafer and determining the precise location thereof on the wafer. Once the precise location of a selected known good die is known, fork 125 and frame 111 can be moved to align that die with pick head device 150 for the extraction process discussed above.

A computer keeps track of the location of each die on conveyor belt 170, which moves from left to right as it is seen in FIG. 1. Conveyor belt 170 is made of stainless steel and is advantageously coated with an elastomer or silicone compound to increase the friction between the die and the belt. Motor 177 drives conveyor belt 170 in response to commands from a CPU (not shown). The CPU keeps track of the position of each die on the conveyor belt and can be programmed to advance as each die is removed from the pickup location except during the placing operation by pick head 150. Additionally, a sensor 176 comprising a photo-emitter optical fiber and a photo-detecting optical fiber. The optical fibers are respectively attached to a light source and a photo-sensor and enable the sensor to determine if a die is blocking light from the photo-emitter optical fiber to the photo-detecting optical fiber. When a die is present at pickup location 173, a signal from sensor 176 is transmitted to the CPU (not shown) which can respond by halting motor 177.

Figure 8:
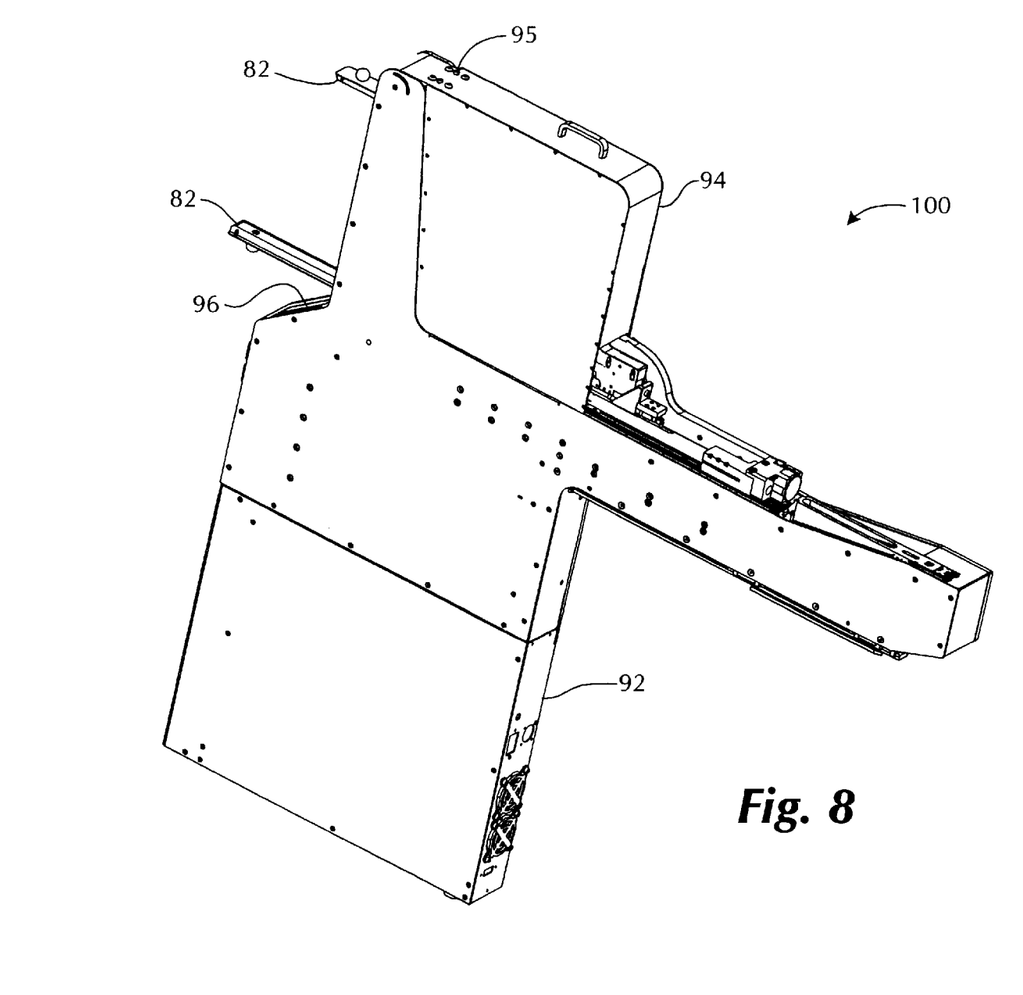
FIG. 8 is a perspective view of the invention fully assembled.
Figure 9:
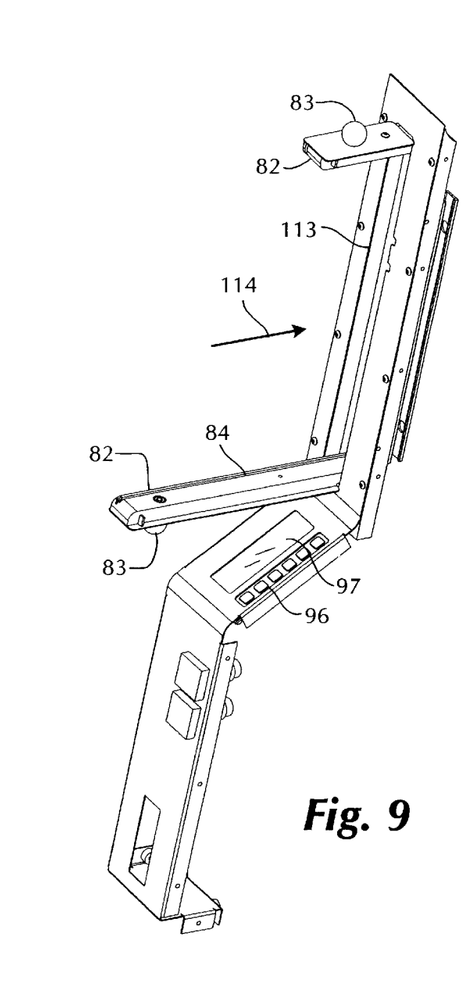
FIG. 9 is a perspective view of the back panel, showing the wafer doors and control panel.

FIG. 8 shows the fully assembled die feeder 100 in perspective view. Die feeder 100 includes a service access 94 which is transparent to allow viewing of the operation of the invention. Service access 94 pivots upward at hinge 95 to permit periodic maintenance and servicing of the moving parts inside. Cabinet 92 houses the CPU and control systems. A control panel 96, shown also in FIG. 9, is provided which controls the function of the apparatus, which can also be controlled remotely through a network connection.

The invention having now been described with particularity to a single embodiment, it is understood that the scope of protection sought is limited not by the detailed description above, but by the claims appended hereto.

We claim:

1. A die feeder comprising:

a wafer support defining an x–y planar srrface;

a conveyor belt extending from a position adjacent said wafer support to a pickup location;

a pick head operable to remove die from a wafer mountable in said wafer support and place said die on said conveyor belt;

said conveyor belt operable to convey said die to said pickup location; and a die sensor located at said pickup location which generates a signal in response to the presence of one of said die at said pickup location.

2. The die feeder set forth in claim 1 wherein said die feeder further comprises means for moving at least one of said pick head and said wafer support such that said pick head has access to every point along said x–y planar surface.

3. The die feeder set forth in claim 1 further comprising a die ejector head by opposite said wafer support of said pick head, said die ejector head rotatably mounted along an axis which is parallel to said x–y planar surface.

4. The die feeder set forth in claim 1 wherein said pick head is mounted on a first arm of a fork member which extends along a first side of said wafer support, said fork member having a second arm which extends along a second side of said wafer support, said fork member being mounted to permit motion only in an x direction relative to the x–y planar surface.

5. The die feeder set forth in claim 1 further comprising a first automatic positioning motivator which moves said wafer support in a y direction relative to said x–y planar surface and a second automatic positioning motivator which moves said pick head in an x direction relative to said x–y planar surface, said x direction being perpendicular to said y direction.

6. The die feeder set forth in claim 5 further comprising a control unit controlling said first automatic positioning motivator, said second automatic positioning motivator, said conveyor belt, and said pick head.

7. The die feeder set forth in claim 1 further comprising a transfer head and wherein said pick head is operable to place said die from said wafer directly onto said conveyor belt in a conventional orientation and also operable to pass said die from said wafer to said transfer head, said transfer head being operable to take said die from said pick head then place said die on said conveyor belt in a flipped orientation.

8. The die feeder set forth in claim 1 wherein said wafer support is adapted to support a wafer at an angle from a horizontal surface.

9. The die feeder set forth in claim 1 wherein said wafer support is adapted to support a wafer substantially vertically.

10. A method for removing die from an wafer and conveying said die to a pickup location, comprising the steps of extracting a die from said wafer using a pick head;

placing said die directly on a conveyor belt adjacent to said wafer; and operating said conveyor belt to transport said die to a pickup location.

11. A method of removing a die from an wafer and presenting said die in one of a conventional and a flipped orientation comprising the steps of extracting a die from said wafer using a pick head;

placing said die directly on a conveyor belt if the die is to be presented in a conventional orientation;

passing said die to a transfer head which then places the die on the conveyor belt if the die is to be presented in a flipped orientation; and operating said conveyor belt to transport said die to a pickup location.

12. The method set forth in claim 11 further comprising the step of first locating and qualifying a die for extraction using a machine vision system.

13. The method set forth in claim 12 wherein said step of locating and qualifying a die is performed using a machine vision system.

14. The method set forth in claim 11 wherein said wafer has circuitry etched in a first surface, said wafer is sawed and adhered on a second surface thereof to a flexible film which is held in a stretched condition in a wafer ring and said die is any of a number of die forming said wafer and having a first and second surface corresponding to said first and second surface of said wafer, said step of extracting further comprises the steps of extending the pick head to said first surface of said die;

extending an ejector head to said second surface of said wafer covering a section of said flexible film which has at its center the location of said die;

applying suction to said flexible film using said ejector head to hold said section of flexible film against said ejector head;

applying a vacuum to said pick head;

extending at least one pin from said ejector head through said flexible film to contact said second surface of said die, separating said die from said film and forcing said die to said pick head; and retracting the pick head.

* * * * *